United States Patent
Yu et al.

(10) Patent No.: US 7,667,271 B2
(45) Date of Patent: Feb. 23, 2010

(54) FIN FIELD-EFFECT TRANSISTORS

(75) Inventors: Chen-Hua Yu, Hsin-Chu (TW);
Yu-Rung Hsu, Tainan (TW); Chen-Nan Yeh, Hsi-Chih (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 335 days.

(21) Appl. No.: 11/741,602

(22) Filed: Apr. 27, 2007

(65) Prior Publication Data
US 2008/0265321 A1    Oct. 30, 2008

(51) Int. Cl.
*H01L 23/62* (2006.01)
(52) U.S. Cl. .................. 257/347; 257/401; 438/300
(58) Field of Classification Search ........... 257/347, 257/401; 438/300, 481
See application file for complete search history.

(56) References Cited

U.S. PATENT DOCUMENTS

| | | | |
|---|---|---|---|
| 6,905,622 B2 | 6/2005 | Padhi et al. | |
| 7,514,325 B2 * | 4/2009 | Kim et al. | 438/279 |
| 2005/0173768 A1 * | 8/2005 | Lee et al. | 257/401 |
| 2007/0235818 A1 * | 10/2007 | Anderson et al. | 257/401 |

OTHER PUBLICATIONS

Lee, Y.-P., et al., "Selective Copper Metallization by Electrochemical Contact Displacement with Amorphous Silicon Film," Electrochemical and Solid-State Letters, vol. 4, No. 7, 2001, pp. C47-C49.
Magagnin, L., et al., "Gold Deposition by Galvanic Displacement on Semiconductor Surfaces: Effect of Substrate on Adhesion," J. Phys. Chem. B, vol. 106, No. 2, 2002, pp. 401-407.

* cited by examiner

*Primary Examiner*—Zandra Smith
*Assistant Examiner*—Paul E Patton
(74) *Attorney, Agent, or Firm*—Slater & Matsil, L.L.P.

(57) ABSTRACT

A fin field-effect transistor (finFET) with improved source/drain regions is provided. In an embodiment, the source/drain regions of the fin are removed while spacers adjacent to the fin remain. An angled implant is used to implant the source/drain regions near a gate electrode, thereby allowing for a more uniform lightly doped drain. The fin may be re-formed by either epitaxial growth or a metallization process. In another embodiment, the spacers adjacent the fin in the source/drain regions are removed and the fin is silicided along the sides and the top of the fin. In yet another embodiment, the fin and the spacers are removed in the source/drain regions. The fins are then re-formed via an epitaxial growth process or a metallization process. Combinations of these embodiments may also be used.

18 Claims, 10 Drawing Sheets

FIN FIELD-EFFECT TRANSISTORS

TECHNICAL FIELD

The present invention relates generally to semiconductor devices and, more particularly, to fin field-effect transistors (finFETs) and methods of manufacture.

BACKGROUND

The dominant semiconductor technology used for the manufacture of ultra-large scale integrated (ULSI) circuits is the metal-oxide-semiconductor field effect transistor (MOSFET) technology. Reduction in the size of MOSFETs has provided continued improvement in speed, performance, circuit density, and cost per unit function over the past few decades. As the gate length of the conventional bulk MOSFET is reduced, the source and drain increasingly interact with the channel and gain influence on the channel potential. Consequently, a transistor with a short gate length suffers from problems related to the inability of the gate to substantially control the on and off states of the channel.

Phenomena such as reduced gate control associated with transistors with short channel lengths are termed short-channel effects. Increased body doping concentration, reduced gate oxide thickness, and ultra-shallow source/drain junctions are ways to suppress short-channel effects. However, for device scaling well into the sub-30 nm regime, approaches involving the use of fin field-effect transistors (finFETs) are being investigated to improve the short channel effects.

Generally, finFETs comprise raised source/drain regions having one or more raised channel regions, referred to as a fin. A gate dielectric and a gate electrode are formed over the fin. It has been found that finFETs provide for improved scalability as design requirements shrink and better short-channel control. It is difficult, however, to achieve a uniform three-dimensional implantation of the source/drain regions. Furthermore, deposition of nickel for creating a silicide contact on a high aspect fin frequently results in non-uniform coverage. It is also difficult to form lightly-doped drains in the fins.

As a result, an improved structure and method of fabricating a finFET are needed.

SUMMARY OF THE INVENTION

These and other problems are generally solved or circumvented, and technical advantages are generally achieved, by preferred illustrative embodiments of the present invention which provide a fin field-effect transistor having an improved fin.

In accordance with an embodiment of the present invention, a finFET is provided in which the source/drain regions of the fin comprise a different material than the channel region of the fin. The source/drain regions of the fin are removed and re-formed of a material such as an epitaxially grown silicon germanium, silicon carbon, or the like, while the channel region of the fin is formed from a portion of the underlying substrate. Electroless plating may also be used to re-form the source/drain regions of the fin.

In accordance with yet another embodiment of the present invention, a finFET is provided in which spacers alongside the fin in the source/drain regions are absent. The vertical surfaces, as well as the top surface of the fin in the source/drain regions may then be silicided. In another embodiment, the fin is replaced with, for example, an epitaxially grown material or an electroless plated material.

In accordance with yet another embodiment of the present invention, a finFET in which the source/drain regions of the fin are larger than the fin in the channel region is provided. The spacers alongside of the fin in the source/drain regions are removed. The sidewalls of the fin in the source/drain regions are silicided, extending the fin in the source/drain regions over a dielectric layer overlying the substrate. In another embodiment, the fin is replaced with, for example, an epitaxially grown material or an electroless plated material.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred illustrative embodiments are discussed in detail below. It should be appreciated, however, that the present invention provides many applicable inventive concepts that can be embodied in a wide variety of specific contexts. The specific illustrative embodiments discussed are merely illustrative of specific ways to make and use the invention, and do not limit the scope of the invention.

Embodiments of the present invention provide several improved methods for the formation of semiconductor devices and the resulting structures. These embodiments are discussed below in the context of forming finFET transistors having a single or multiple fins on a bulk silicon substrate. One of ordinary skill in the art will realize that embodiments of the present invention may be used with other configurations, such as, for example, omega-FETs or structures having two or more fins.

Figure 1A:
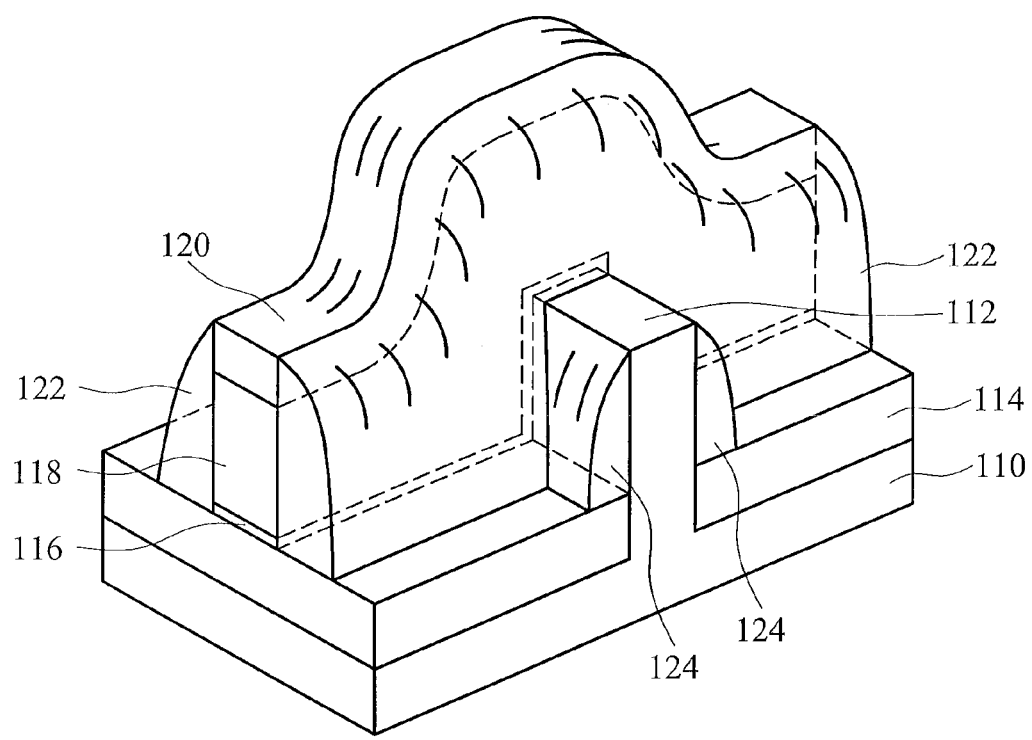
FIGS. 1a-1e are three-dimensional views of a portion of a wafer illustrating various process steps of forming a finFET in accordance with an embodiment of the present invention.

FIGS. 1a-1e illustrate a first method of forming a finFET device in accordance with an embodiment of the present invention. Referring first to FIG. 1a, a portion of a wafer comprising a substrate 110, a fin 112, a dielectric layer 114, a gate insulator layer 116, a gate electrode 118, a first mask 120, gate spacers 122, and fin spacers 124 is shown. The structure illustrated in FIG. 1a is provided for illustrative purposes only and may be formed by any suitable method for forming a finFET such as that illustrated in FIG. 1a.

Generally, the substrate 110 may be any semiconductor material and may comprise known structures including a graded layer or a buried oxide, for example. In an embodiment, the substrate 110 comprises bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 110. Alternatively, the silicon substrate 110 may be an active layer of a semiconductor-on-insulator (SOI) substrate or a multi-layered structure such as a silicon-germanium layer formed on a bulk silicon layer. In a preferred embodiment, however, the substrate 110 is bulk silicon.

The fin 112 may be formed, for example, by patterning and etching the substrate 110 by using photolithography techniques. Generally, a layer of photoresist material is deposited over the substrate 110. The layer of photoresist material is irradiated (exposed) in accordance with a desired pattern (the fin 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

The dielectric layer 114 may be formed by any oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor. In another embodiment, the dielectric layer 114 may be formed by implanting ions, such as oxygen, nitrogen, carbon, or the like, into the silicon substrate 110. In yet another embodiment, the dielectric layer 114 is the insulator layer of a SOI wafer.

The gate insulator layer 116, which prevents electron depletion, is preferably an oxide layer formed by any oxidation process, such as wet or dry thermal oxidation in an ambient comprising an oxide, $H_2O$, NO, or a combination thereof, an in-situ steam generation (ISSG) process in an ambient environment of $O_2$, $H_2O$, NO, a combination thereof, or the like, or by chemical vapor deposition (CVD) techniques using tetra-ethyl-ortho-silicate (TEOS) and oxygen as a precursor. Other materials including, high k dielectric materials, such as: $HfO_2$, $HfSiO_2$, ZnO, $ZrO_2$, $Ta_2O_5$, $Al_2O_3$ and the like, and other processes, such as Atomic Layer Deposition (ALD), Atomic Vapor Deposition (AVD), and the like, may also be used.

The gate electrode layer 118 preferably comprises a semiconductor material such as polysilicon, amorphous silicon, or the like that has been deposited and patterned as illustrated in FIG. 1a. The gate electrode layer 118 may be deposited doped or undoped. For example, in an embodiment the gate electrode layer 118 comprises polysilicon deposited undoped by low-pressure chemical vapor deposition (LPCVD). Once applied, the polysilicon may be doped with, for example, phosphorous ions (or other P-type dopants) to form a PMOS device or boron (or other N-type dopants) to form an NMOS device. The polysilicon may also be deposited, for example, by furnace deposition of an in-situ doped polysilicon. Alternatively, the gate electrode layer 118 may comprise a polysilicon metal alloy or a metal gate comprising metals such as tungsten, nickel, and titanium, for example.

The first mask 120 is a protective layer to prevent the underlying structures (e.g., the gate electrode 118) from being removed during subsequent processes, such as etching or implanting steps. One such suitable first mask 120 comprises an oxide layer and/or a nitride layer. The oxide layer may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. The nitride layer may be formed using CVD techniques using silane and ammonia as precursor gases, and deposition temperatures ranging from 550° to 900° C. The nitride layer may comprise other nitrogen containing layers, such as silicon oxynitride $SiO_xN_y$, silicon oxime $SiO_x\text{-}N_y:H_z$, or a combination thereof.

One of ordinary skill in the art will appreciate that other mask materials and/or structures may be used to form the first mask 120. For example, other materials, a single layer, three or more layers, or the like may be used.

The gate spacers 122 and the fin spacers 124 may be formed by depositing a dielectric layer and patterning the dielectric layer by, for example, performing an isotropic etch process. In an embodiment the gate spacers 122 and the fin spacers 124 are formed of a nitrogen containing layer such as silicon nitride, silicon oxynitride, silicon oxime, or the like. A silicon nitride layer may be formed using chemical vapor deposition (CVD) techniques using silane and ammonia as precursor gases. Once formed, an isotropic etch process may be used to remove the dielectric material on top of the first mask 120 and the areas of substrate 110 not immediately adjacent to the gate electrode 118, leaving the gate spacers 122 and fin spacers 124 as illustrated in FIG. 1a.

Figure 1B:
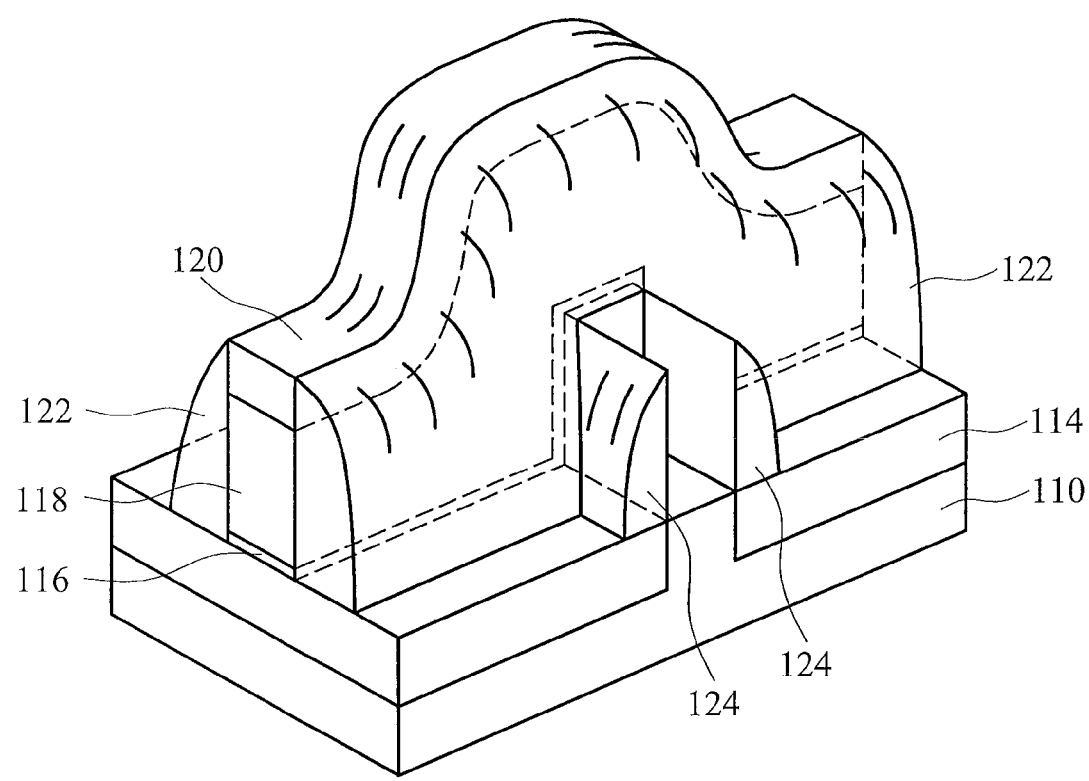

FIG. 1b illustrates the removal of the fin 112 in accordance with an embodiment of the present invention. The fin 112 may be removed, for example, by performing a dry etch process using $HBr/O_2$, $HBr/Cl_2/O_2$, or $SF_6/CL_2$ plasma.

Figure 1C:
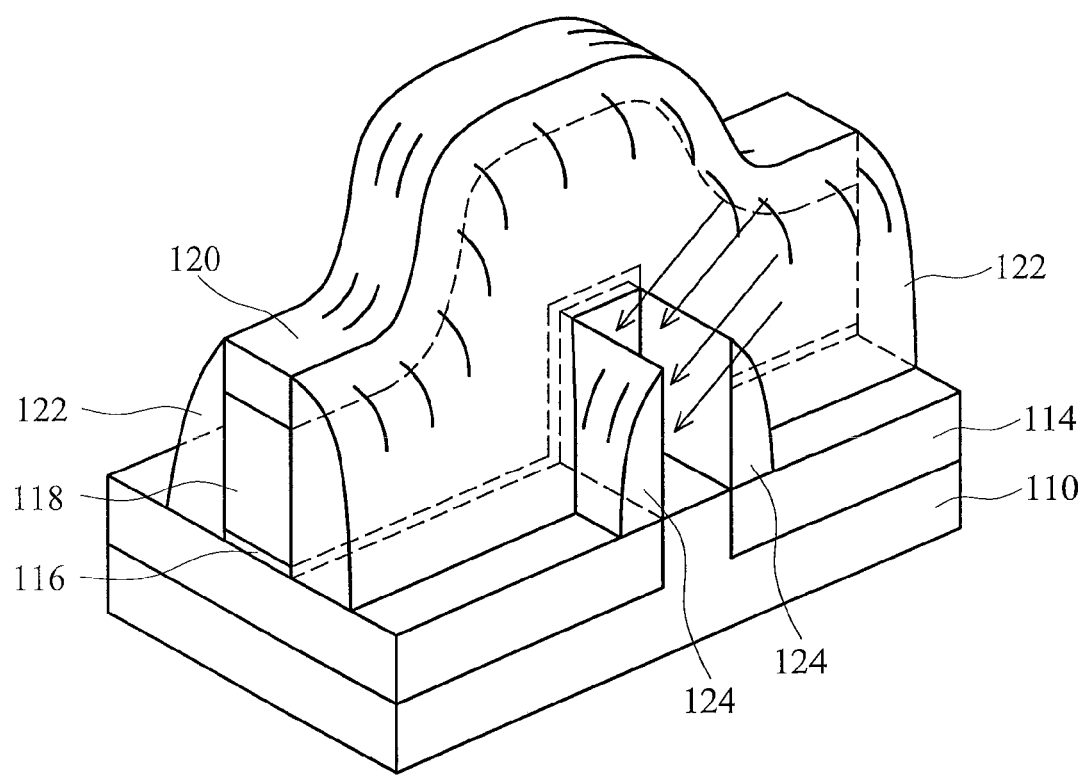

FIG. 1c illustrates a doping of remaining portions of the fin 112 in accordance with an embodiment of the present invention. As illustrated in FIGS. 1b and 1c, a portion of the fin 112 under the gate spacers 122 may remain after the etching process discussed above with reference to FIG. 1b. The doping implants ions into this remaining portion of the fin 112 to form lightly-doped drains (LDD).

The doping process may be performed by implanting N-type dopants, such as phosphorous, arsenic, nitrogen, antimony, or the like to form an NMOS device. In an embodiment, phosphorous ions are implanted at an angle of about 0° to about 80° relative to a vertical surface of the gate electrode at a dose of about 5E13 to about 2E15 atoms/cm² and at an energy of about 2 to about 5 KeV. A PMOS device may be formed by implanting P-type dopants, such as boron, aluminum, gallium, indium, or the like, at a similar angle as the NMOS device. In an embodiment, boron ions are implanted at a dose of about 5E13 to about 2E15 atoms/cm² and at an energy of about 2 to about 5 KeV.

Figure 1D:
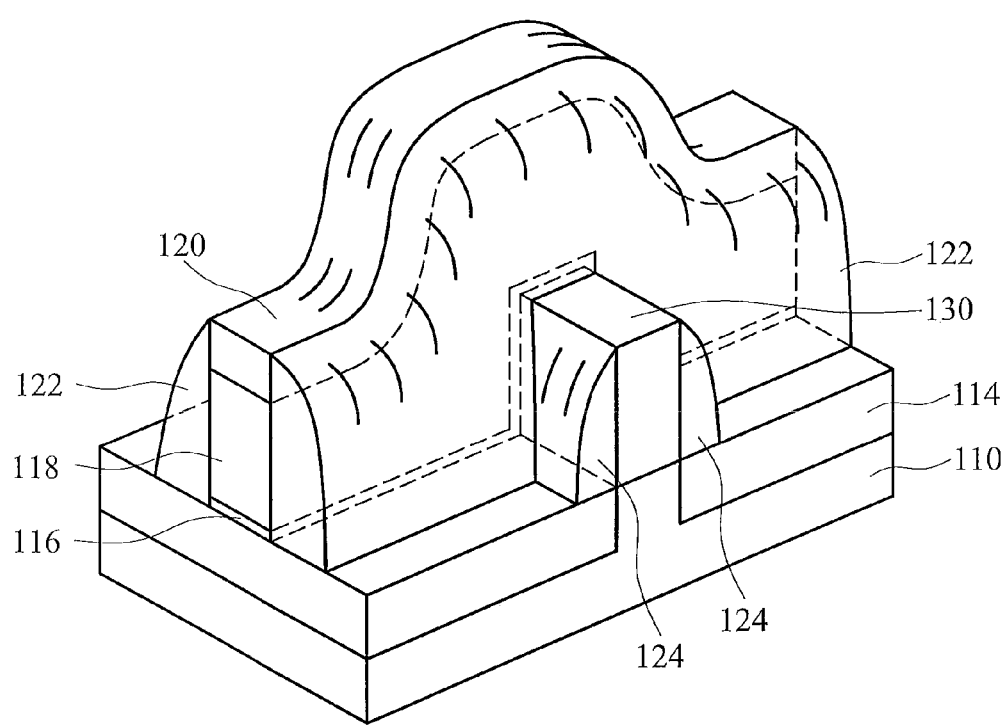

FIG. 1d illustrates the reformation of a re-formed fin 130. In an embodiment, the re-formed fin 130 comprises epitaxially grown silicon, silicon germanium, silicon carbon, or the like. The re-formed fin 130 may be in-situ doped as the re-formed fin 130 is being grown. For example, a silicon carbon fin may be formed by epitaxially growing silicon carbon in an ambient of phosphorous having a concentration of about 1E19 to about 1E21 atoms/cm³ to form an NMOS device and a silicon germanium fin may be formed by epitaxially growing silicon germanium in an ambient of boron having a concentration of about 1E19 to about 1E21 atoms/cm³ to form a PMOS device.

Alternatively, the re-formed fin 130 may be doped after the re-formed fin has been grown. For example, a silicon germanium fin may be doped after it has been grown by implanting phosphorous ions at a dose of about 1E14 to about 1E16 atoms/cm² and at an energy of about 5 to about 20 KeV to form an NMOS device. A PMOS device may be formed by implanting boron ions at a dose of about 1E14 to about 1E6 atoms/cm² and at an energy of about 5 to about 20 KeV. Other N-type and P-type dopants may be used.

In yet another embodiment, the re-formed fin 130 may comprise a metal formed by electroless plating. In an embodiment, the Contact Displacement Electroless Plating (CDE, or Galvanic reaction) process is used to form a seed layer on the underlying silicon of the substrate 110. In general, the nobel metals, such as Pd, Pt, Au, etc., which have high standard oxidation potentials, selectively react only with the exposed portions of silicon. For example, once the native oxide is removed, the contact displacement of Pd ions from silicon is carried out by electrochemical redox between $Si^\circ$ and $Pd^{2+}$ ions in an aqueous solution containing $F^-$ ions. Thus, the Pd seed layer is selectively plated in plating bath only on a Si surface. Thereafter, the reforming of the re-formed fin 130 can be performed using electroless plating techniques to form a metal fin comprising, for example, Pd, Pt, Au, Ni, CoWP, CO, CoW, Cu, and the like. As one of ordinary skill in the art will appreciate, electroplating techniques may also be used form the re-formed fin 130.

In yet another embodiment, the re-formed fin 130 may comprise a metal formed by electrochemical plating. Because the surface of the recess fin is the only exposed conductive area, electrochemical plating will take place selectively. For example, a solution comprising 0.01M $Na_3Au(S_2O_3)_2$, 0.1M $Na_2S_2O_3$, 0.1M $Na_2SO_3$, 0.3M $Na_2HPO_4$, and 1 mM HF may be used for the electrochemical plating to reform a golden fine. Preferably, an anneal is performed after forming the re-formed fin 130. In an embodiment, an anneal is performed at a temperature of about 400° C. for about 30 seconds.

Figure 1E:
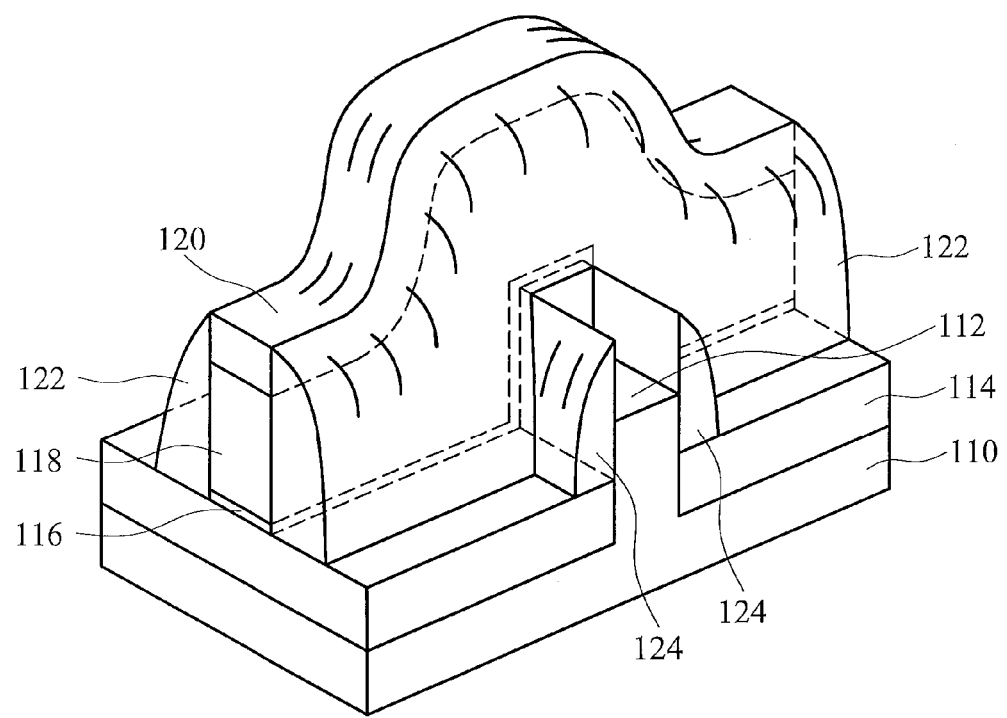

FIG. 1e illustrates yet still another embodiment in accordance with an embodiment of the present invention. In particular, FIG. 1e illustrates an embodiment after FIG. 1a in which the fin 112 is partially removed. In an embodiment, the fin 112 is removed to a top surface of the dielectric layer 114. In another embodiment, the fin 112 is partially removed. In a preferred embodiment, the height of the fin (measured above the top surface of the first dielectric layer 114) is reduced by 50-85%. For example, in an embodiment in which the fin 112 has a height of about 600 Å, about 300 Å to about 500 Å of the fin is removed, resulting in a fin 112 having a height of about 100 Å to about 300 Å. Thereafter, a doping process may be performed as discussed above with reference to FIG. 1c, and the fin 112 may be re-formed as discussed above with reference to FIG. 1d.

In another embodiment, the fin 112 of FIG. 1e may be re-formed by forming a metal layer (not shown) over the fin 112 and subsequently performing an anneal, thereby forming a silicide region (not shown). In this embodiment, the resulting structure is similar to that illustrated FIG. 1d.

Figure 2A:
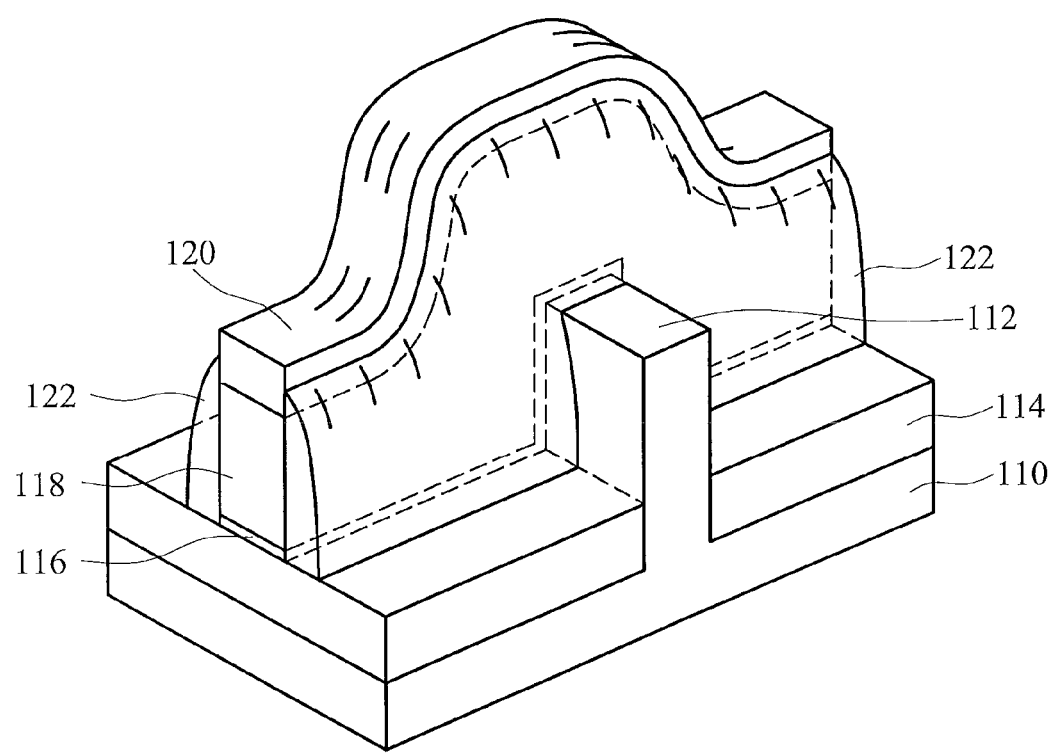
FIGS. 2a-2c are three-dimensional views of a portion of a wafer illustrating various process steps of forming a finFET in accordance with another embodiment of the present invention.
Figure 2B:
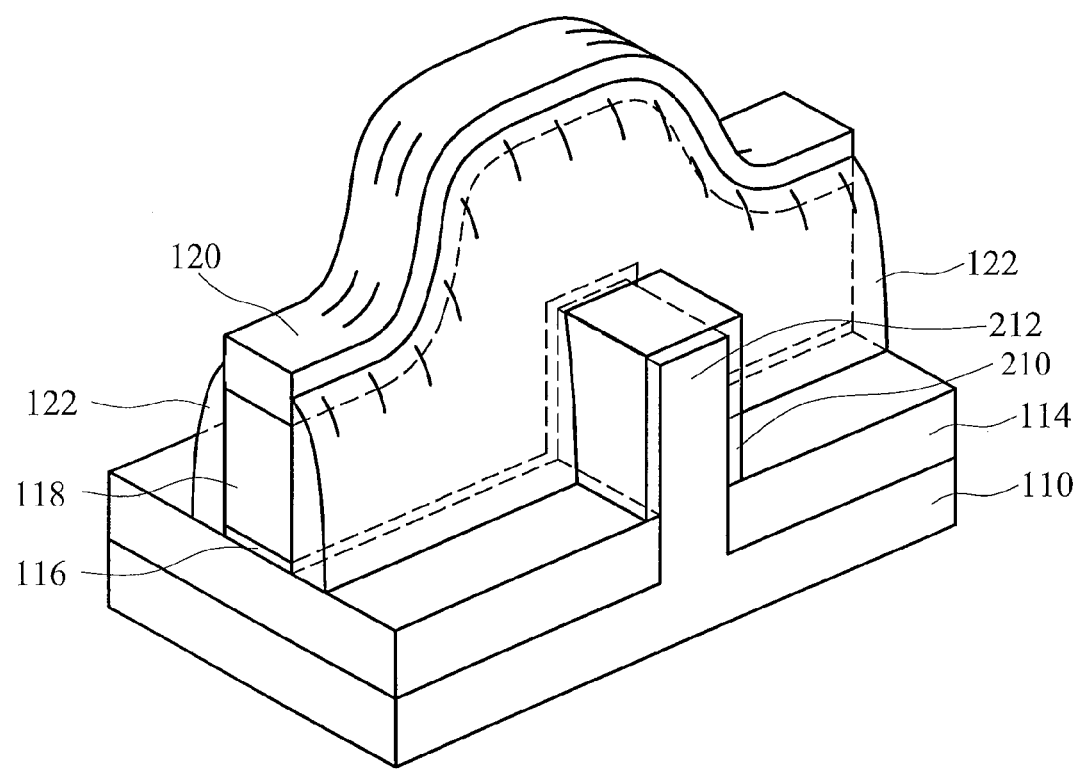
Figure 2C:
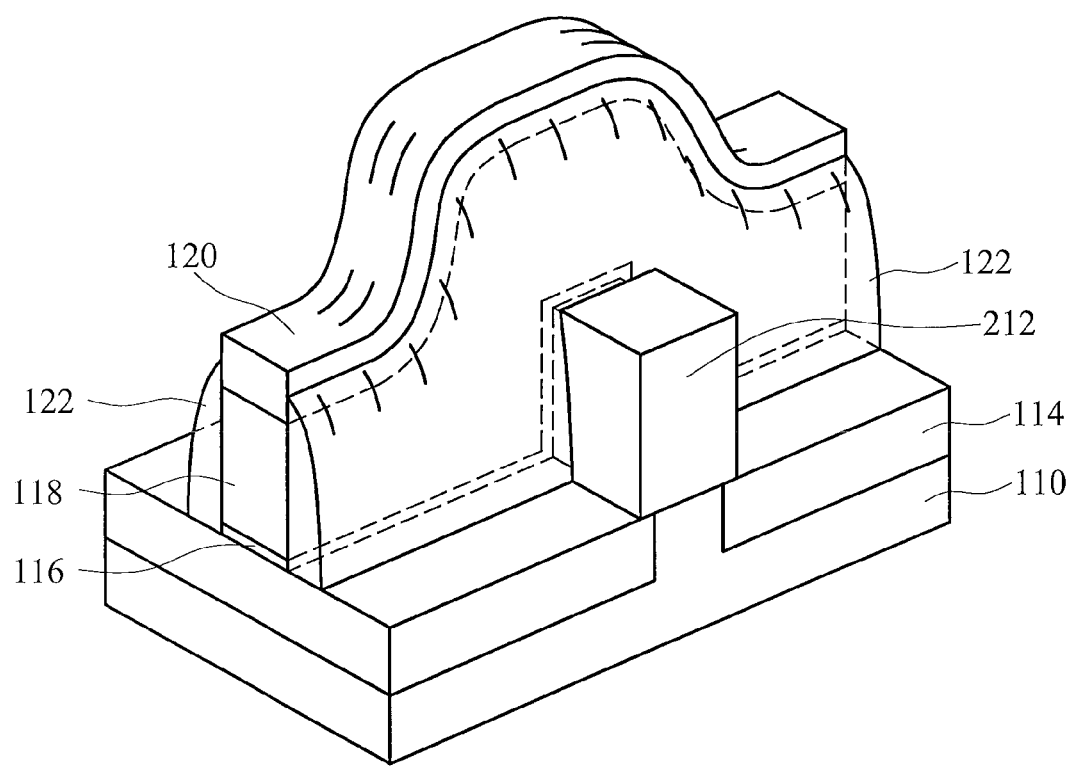

FIGS. 2a-2c illustrate another embodiment of forming a finFET in accordance with the present invention. It should be noted that FIGS. 2a-2c assume a structure such as that illustrated in FIG. 1a, wherein like reference numerals refer to like elements. Accordingly, FIG. 2a illustrates the removal of the fin spacers 124 (see FIG. 1a). The fin spacers 124 may be removed using an isotropic etch process. It should be noted that embodiments of the present invention may utilize the same material to form the fin spacers 124 and the gate spacers 122, and as a result, part of the gate spacers 122 may also be removed. This is illustrated in FIG. 2a by illustrating that the gate spacers 122 are recessed from the top of the first mask 120 (see FIG. 1a). Because of this, it is preferred that the first mask 120 be of a sufficient thickness such that after the fin spacers 124 have been removed and the gate spacers 122 have been recessed, the gate electrode 118 is still protected by the first mask 120 on the top and the gate spacers 122 on the sides. In this manner, the gate electrode 118 will be protected from subsequent processing steps.

FIG. 2b illustrates formation of a metal layer 210 over the fin 112. In an embodiment, the metal layer 210 comprises nickel, cobalt, or the like formed by electroless plating or electrochemical plating as discussed above.

FIG. 2c illustrates a silicidation process in accordance with an embodiment of the present invention. The silicidation process may be performed by annealing at a temperature of about 450° C. to about 550° C. for about 20 seconds to about 40 seconds in an inert ambient preferably comprising nitrogen. The excess material of the metal layer 210 (FIG. 2b) may be removed, for example, by utilizing a suitable etchant having a high etch selectivity between the excess material of the metal layer 210 and the remaining structures of the device, such as the dielectric layer 114, gate spacers 122, and the first mask 120. In an embodiment in which the metal layer 210 comprises nickel, suitable etchants include sulfuric acid, HCl, $H_2O_2$, hydrogen peroxide, $NH_4OH$, or the like.

Optionally, an additional RTA process may be performed to further lower the phase to a low-resistivity silicide. In particular, it has been found that $CoSi_2$ and $TiSi_2$, for example, benefit from an additional RTA process performed at a temperature from about 700° C. to about 900° C. for 20 seconds to about 45 seconds. As one of ordinary skill in the art will appreciate, the annealing process causes the metal layer 210 to selectively react with exposed silicon regions (e.g., the fin 112) to form a silicided fin 212. The silicided fin 212 for the source/drain regions reduce contact resistance between interconnect lines or contact plugs (not shown) and the source/drain regions. In this embodiment, the silicided fin 212 extends over the dielectric layer 114 such that the silicided fin 212 is wider than the fin directly under the gate electrode 118.

Figure 3A:
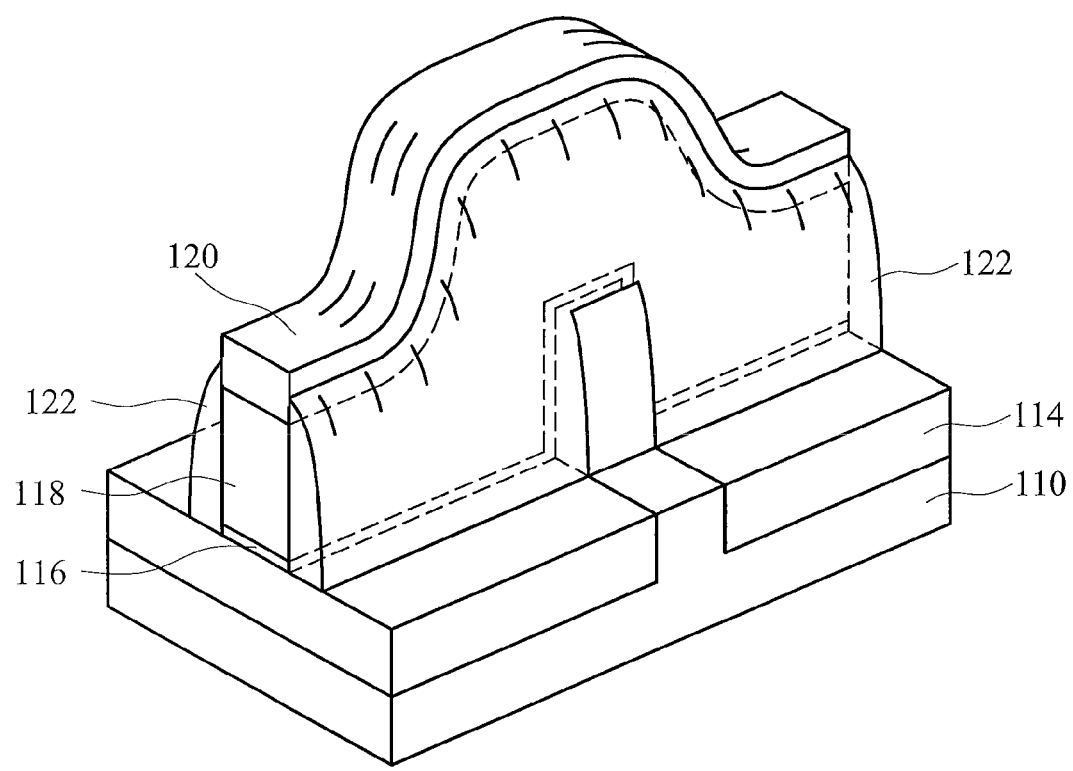
FIGS. 3a-3b are three-dimensional views of a portion of a wafer illustrating various process steps of forming a finFET in accordance with another embodiment of the present invention.
Figure 3B:
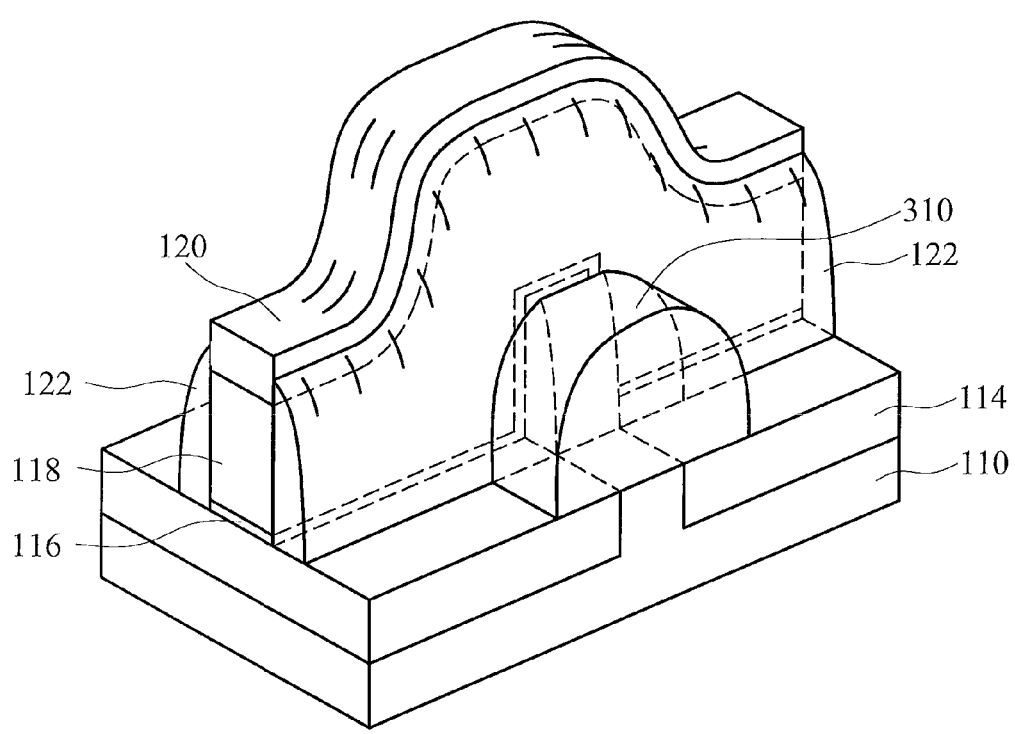

FIGS. 3a-3b illustrate another embodiment of forming a finFET in accordance with the present invention. It should be noted that FIGS. 3a-3b assume a structure such as that illustrated in FIG. 1b, wherein like reference numerals refer to like elements. Accordingly, FIG. 3a illustrates the removal of the fin spacers 124 (see FIG. 1a) after the fin 112 (see FIG. 1a) has been removed. The fin spacers 124 may be removed using an isotropic etch process. It should be noted that embodiments of the present invention may utilize the same material to form the fin spacers 124 and the gate spacers 122, and as a result, part of the gate spacers 122 may also be removed. This is illustrated in FIG. 3a by illustrating that the gate spacers 122 are recessed from the top of the first mask 120 (see FIG. 1a). Because of this, it is preferred that the first mask 120 be of a sufficient thickness such that after the fin spacers 124 have been removed and the gate spacers 122 have been recessed, the gate electrode 118 is still protected by the first mask 120 on the top and the gate spacers 122 on the sides. In this manner, the gate electrode will be protected from subsequent processing steps.

FIG. 3b illustrates the reformation of a re-formed fin 310. In an embodiment, the re-formed fin 310 may be re-formed by an epitaxial process, an electroless plating process, or the like. For example, the re-formed fin 310 may comprise epitaxially grown silicon, silicon germanium, silicon carbon, or the like. The re-formed fin 310 may be in-situ doped as the re-formed fin 310 is being grown. For example, a silicon carbon fin may be formed by epitaxially growing silicon carbon in an ambient of phosphorous having a concentration of about 1E19 to about 1E21 atoms/$cm^3$ to form an NMOS device and a silicon germanium fin may be formed by epitaxially growing silicon germanium in an ambient of boron having a concentration of about 1E19 to about 1E21 atoms/$cm^3$ to form a PMOS device.

Alternatively, the re-formed fin 310 may be formed undoped and then doped after the re-formed fin 310 has been grown. For example, a silicon germanium fin may be doped after it has been grown by implanting phosphorous ions at a dose of about 1E14 to about 1E16 atoms/$cm^2$ and at an energy of about 5 to about 20 KeV to form an NMOS device. A PMOS device may be formed by implanting boron ions at a dose of about 1E14 to about 1E16 atoms/cm$^2$ and at an energy of about 5 to about 20 KeV. Other N-type and P-type dopants may be used. In this embodiment, the re-formed fin 310 extends over the dielectric layer 114 such that the re-formed fin 310 is wider than the fin directly under the gate electrode 118 along an axis parallel to the longitudinal axis of the gate electrode 118.

As another example, the re-formed fin 310 may be a metal gate formed by electroless plating or electrochemical plating as discussed above.

One of ordinary skill in the art will appreciate that the embodiment disclosed herein may reduce the contact resistance by using a silicide region and/or metal source/drain regions. Furthermore, embodiments discussed herein, particularly those utilizing epitaxially grown silicon, silicon germanium, and silicon carbon, may be used to impart stress in the channel region, thereby improving the hole/electron movement. A simplified process flow may also be obtained by the embodiments disclosed herein.

Although the present invention and its advantages have been described in detail, it should be understood that various changes, substitutions and alterations can be made herein without departing from the spirit and scope of the invention as defined by the appended claims.

Moreover, the scope of the present application is not intended to be limited to the particular illustrative embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding illustrative embodiments described herein may be utilized according to the present invention. Accordingly, the appended claims are intended to include within their scope such processes, machines, manufacture, compositions of matter, means, methods, or steps.

What is claimed is:

1. A fin field-effect transistor (finFET) comprising:
   a substrate;
   a fin having a first region, a second region, and a third region, the second region being interposed between the first region and the third region, the first region and the third region comprising a first material and the second region comprising a second material, the first material being different than the second material, the fin in the first region and the third region being completely formed of metal;
   a gate dielectric overlying the substrate and the fin, the gate dielectric overlying the fin in the second region; and
   a gate electrode overlying the gate dielectric.

2. The finFET of claim 1, wherein the substrate comprises a silicon substrate and further comprises a dielectric layer thereon, the silicon substrate extending through the dielectric layer under the fin.

3. The finFET of claim 1, further comprising fin spacers alongside the fin.

4. The finFET of claim 1, wherein the second material comprises a portion of a bulk silicon substrate.

5. The finFET of claim 1, further comprising a lightly-doped drain in the fin on opposing sides of the gate electrode.

6. The finFET of claim 5, wherein the lightly-doped drain extends substantially an entire height of the fin adjacent the gate electrode.

7. A fin field-effect transistor (finFET) comprising:
   a substrate;
   a dielectric layer formed over the substrate;
   a fin extending from the substrate through the dielectric layer, the fin including source/drain regions and a channel region;
   a gate dielectric overlying the substrate and the fin, the gate dielectric overlying a portion of the fin;
   a gate electrode overlying the gate dielectric; and
   gate spacers formed adjacent the gate electrode such that fin spacers adjacent to the fin are absent.

8. The finFET of claim 7, wherein the fin comprises a silicon substrate extending through the dielectric layer, a top surface and side surfaces of the fin being silicided.

9. The finFET of claim 7, wherein the source/drain regions comprise epitaxially grown material.

10. The finFET of claim 9, wherein the epitaxially grown material comprises epitaxially grown silicon, epitaxially grown silicon germanium, or epitaxially grown silicon carbon.

11. The finFET of claim 7, wherein a first dimension of the source/drain regions of the fin along a first axis normal to a longitudinal axis of the fin and parallel to a major surface of the substrate is greater than a second dimension of the channel region of the fin along a second axis parallel to the first axis.

12. The finFET of claim 7, wherein the source/drain regions comprise a metal.

13. A fin field-effect transistor (finFET) comprising:
   a substrate;
   a first dielectric layer overlying the substrate, a portion of the substrate extending through at least a portion of the first dielectric layer;
   a gate dielectric overlying the first dielectric layer and a portion of the substrate extending through the gate dielectric;
   a gate electrode overlying the gate dielectric;
   spacers alongside opposing sides of the gate electrode; and
   source/drain structures alongside the gate electrode, the source/drain structures comprising at least a first portion contacting the substrate extending through the first dielectric layer and at least a second portion overlying a portion of the first dielectric layer.

14. The finFET of claim 13, wherein the source/drain structures comprise epitaxially grown material.

15. The finFET of claim 14, wherein the epitaxially grown material comprises epitaxially grown silicon, epitaxially grown silicon germanium, or epitaxially grown silicon carbon.

16. The finFET of claim 13, wherein the source/drain structures comprise a metal.

17. The finFET of claim 13, wherein the source/drain structures comprise a silicide region.

18. The finFET of claim 13, wherein the substrate is a bulk silicon substrate.

* * * * *